United States Patent
Chang

(10) Patent No.: US 9,625,086 B2
(45) Date of Patent: Apr. 18, 2017

(54) FIXING DEVICE

(71) Applicant: Michael Chau-Lun Chang, Taipei (TW)

(72) Inventor: Michael Chau-Lun Chang, Taipei (TW)

( * ) Notice: Subject to any disclaimer, the term of this patent is extended or adjusted under 35 U.S.C. 154(b) by 103 days.

(21) Appl. No.: 14/695,056

(22) Filed: Apr. 24, 2015

(65) Prior Publication Data

US 2016/0312946 A1    Oct. 27, 2016

(51) Int. Cl.

| | |
|---|---|
| A47B 96/00 | (2006.01) |
| A47K 1/00 | (2006.01) |
| A47K 5/00 | (2006.01) |
| E04G 5/06 | (2006.01) |
| F16L 3/08 | (2006.01) |
| F21V 21/00 | (2006.01) |
| F21V 35/00 | (2006.01) |
| F16M 13/02 | (2006.01) |
| H05K 5/00 | (2006.01) |
| F16M 11/04 | (2006.01) |
| F16M 11/10 | (2006.01) |
| F16M 13/00 | (2006.01) |
| F16B 47/00 | (2006.01) |
| F16B 1/00 | (2006.01) |
| F16B 21/08 | (2006.01) |

(52) U.S. Cl.
CPC .......... *F16M 13/02* (2013.01); *F16M 11/041* (2013.01); *F16M 11/105* (2013.01); *F16M 13/00* (2013.01); *H05K 5/0086* (2013.01); *F16B 21/086* (2013.01); *F16B 47/00* (2013.01); *F16B 2001/0028* (2013.01)

(58) Field of Classification Search
CPC ............................. F16B 37/045; A47B 96/061
USPC ............ 248/220.21, 220.22, 222.11, 222.12, 248/222.13, 222.51, 222.52, 223.31, 248/223.41, 224.51, 224.7, 224.8, 222.41, 248/223.21, 225.11, 205.3, 205.4; 211/193; 403/252, 253
See application file for complete search history.

(56) References Cited

U.S. PATENT DOCUMENTS

| | | | | |
|---|---|---|---|---|
| 4,223,861 A | * | 9/1980 | Guggemos | ........... F16M 11/105 248/222.52 |
| 4,756,638 A | * | 7/1988 | Neyret | .................... E05B 9/084 403/261 |
| 5,186,341 A | * | 2/1993 | Zeid | .................... A47B 61/003 211/123 |

(Continued)

*Primary Examiner* — Terrell McKinnon
*Assistant Examiner* — Michael McDuffie

(57) ABSTRACT

A fixing device includes a base body, a connecting unit and a fixing unit. The base body includes a holding wall and a connecting wall having a connecting hole. The connecting hole has a plurality of tooth-like grooves. The holding wall is provided with a holding element for holding the base body onto a first external object. The connecting unit includes a connecting pole and an engaging element. The engaging element has at least a first engaging leg and a second engaging leg that correspondingly pass through the tooth-like grooves to be engaged in between the connecting wall and the holding wall, so as to connect the connecting unit and the base body, where the base body is rotatable upon the connecting pole. The fixing unit is connected to the connecting pole and is provided with a fixing element for securing the fixing unit onto a second external object.

10 Claims, 18 Drawing Sheets

(56) References Cited

U.S. PATENT DOCUMENTS

| | | | | |
|---|---|---|---|---|
| 6,371,313 | B1* | 4/2002 | Walter | A47F 5/10 |
| | | | | 211/105.1 |
| 7,610,726 | B2* | 11/2009 | Lajewski | F24F 7/00 |
| | | | | 248/220.21 |
| 8,128,043 | B2* | 3/2012 | Walter | A47B 96/061 |
| | | | | 248/221.11 |
| 8,444,100 | B2* | 5/2013 | Takahashi | B60K 15/05 |
| | | | | 211/193 |
| 8,540,198 | B2* | 9/2013 | Keyvanloo | A47B 96/061 |
| | | | | 248/220.21 |
| 8,689,409 | B2* | 4/2014 | Hanley | B60R 13/0206 |
| | | | | 24/114.6 |
| 2009/0084915 | A1* | 4/2009 | Fukumoto | F16B 2/185 |
| | | | | 248/220.21 |
| 2009/0256041 | A1* | 10/2009 | Fox | A47F 5/0823 |
| | | | | 248/225.21 |
| 2011/0163214 | A1* | 7/2011 | Tages | F16M 13/04 |
| | | | | 248/220.21 |
| 2013/0062488 | A1* | 3/2013 | Chen | F16M 13/02 |
| | | | | 248/222.14 |

\* cited by examiner

FIXING DEVICE

BACKGROUND OF THE INVENTION

1. Field of the Invention

The present invention relates to a fixing device, and particularly to a fixing device that is separable and connectable in a quick and easy manner, where one end of the fixing device is to hold an external object and another end is to be secured onto another external object.

2. Related Art

With the vigorous development and widely used of portable electronic devices, users can carry and use them all the time. Such portable electronic devices are known as mobile phones, tablet PC, or digital cameras. However, for certain scenarios or places, users may not be able to use or free their hands to hold a portable device. In such situations, the portable device is to be held by a securing apparatus.

A traditional securing apparatus for securing a portable device is also portable, and has two ends thereof. One end of the securing apparatus is a holding end for holding a portable device, and the other end is a securing end for being secured to an external article or held by hands. The securing end can secure the securing apparatus to, for example, a bar or edges of a desk. Ways of the holding end to hold a portable device are generally categorized into three types according to the structural differences. The first type is to utilize jaws with a pivotal structure to hold a portable device; the second type is to utilize claws being retractable to fix a portable device; the third type is to provide a clamping backing having a size configured to hold a portable device. Though the above three types can hold a portable device, the first or the second type is consisted of complex components and is not benefit for lowering the manufacturing cost, as well as replacement of components. Furthermore, the manner to manipulate the first and second types of securing apparatus is cumbersome. As to the third type, it only allows portable devices to be held onto the clamping backing with compatible size, and is therefore very inconvenient for various shapes of portable devices.

SUMMARY OF THE INVENTION

Accordingly, an object of the present invention is to provide a fixing device that is separable and holds an external object in a manner of adhesive for hands-free convenience.

Another object of the present invention is to provide a fixing device that is capable of being engaged or disengaged quickly and easily, and is rotatable in use.

The fixing device of the present invention comprises a base body comprising a holding wall and a connecting wall spaced apart from the holding wall. The connecting wall forms a connecting hole thereon, the connecting hole comprising a plurality of tooth-like grooves radially extending outward from peripheries of the connecting hole, and a surface of the holding wall opposite to the connecting wall being provided with a holding element for holding the base body onto a first external object. A connecting unit comprises a connecting pole and an engaging element, the connecting pole forming a hollow portion therein which penetrates one end of the connecting pole, the engaging element disposed in the hollow portion and comprising at least a first engaging leg and at least a second engaging leg respectively extending out of the hollow portion and spaced apart from the connecting pole. The at least a first engaging leg and a second engaging leg correspondingly pass through the plurality of tooth-like grooves of the connecting hole to be engaged in between the connecting wall and the holding wall, so as to connect the connecting unit and the base body and allow the base body to be rotatable upon the connecting pole. A fixing unit is connected to another end of the connecting pole, and a surface of the fixing unit is provided with a fixing element for securing the fixing unit onto a second external object.

In one aspect of the present invention, the engaging element comprises an upper arm, a lower arm and a coupling arm coupling the upper and lower arms, the upper arm forming the at least a first engaging leg at a free end of the upper arm opposite to the coupling arm, the lower arm forming the at least a second engaging leg at a free end of the lower arm opposite to the coupling arm, and the upper and lower arms being spaced apart from each other with respect to a vertical middle portion of the coupling arm.

In another aspect of the present invention, the first engaging leg bends perpendicularly and extends outward from the free end of the upper arm, the lower arm includes two the second engaging legs which respectively bend perpendicularly and extend outward from the free end of the lower arm, the plurality of tooth-like grooves include a first groove and two second grooves, and wherein when the engaging element is to engage with the connecting hole, the first engaging leg and the second engaging legs respectively pass though the corresponding first and second grooves, with the first engaging leg being propped against the first groove to push the upper arm towards the lower arm or the second engaging legs being propped against the second grooves to push the lower arm towards the upper arm, so that the first and second engaging legs are capable of passing through the connecting hole to abut against the first and second grooves.

In another aspect of the present invention, a reinforcing element is formed between the upper and lower arms, the reinforcing element comprising two opposite ends respectively connected to the at least a first engaging leg and the at least a second engaging leg, and the reinforcing element comprising at least a bending portion.

In another aspect of the present invention, a positioning frame including a positioning slot formed at a side of the positioning frame, the holding element of the base body extends laterally and bends downward to form a positioning bar for being inserted into the positioning slot to connect the base body to the positioning frame, and a side of the positioning frame opposite to the positioning slot is adhesive to the first external object.

The fixing device of the present invention utilizes the detachable engaging element and the base body to provide a simple structure that enables a quick and easy way of engagement and disengagement. The holding element and the fixing element exemplified by the double-sided adhesive are capable of adhering to the first external object or the second external object for realizing the hands-free advantage and overcoming the drawback of traditional securing apparatus required to be held by users. Furthermore, rotation of the base body enables orientation adjustments of the first external object in use.

DESCRIPTION OF THE PREFERRED EMBODIMENTS

Figure 1:
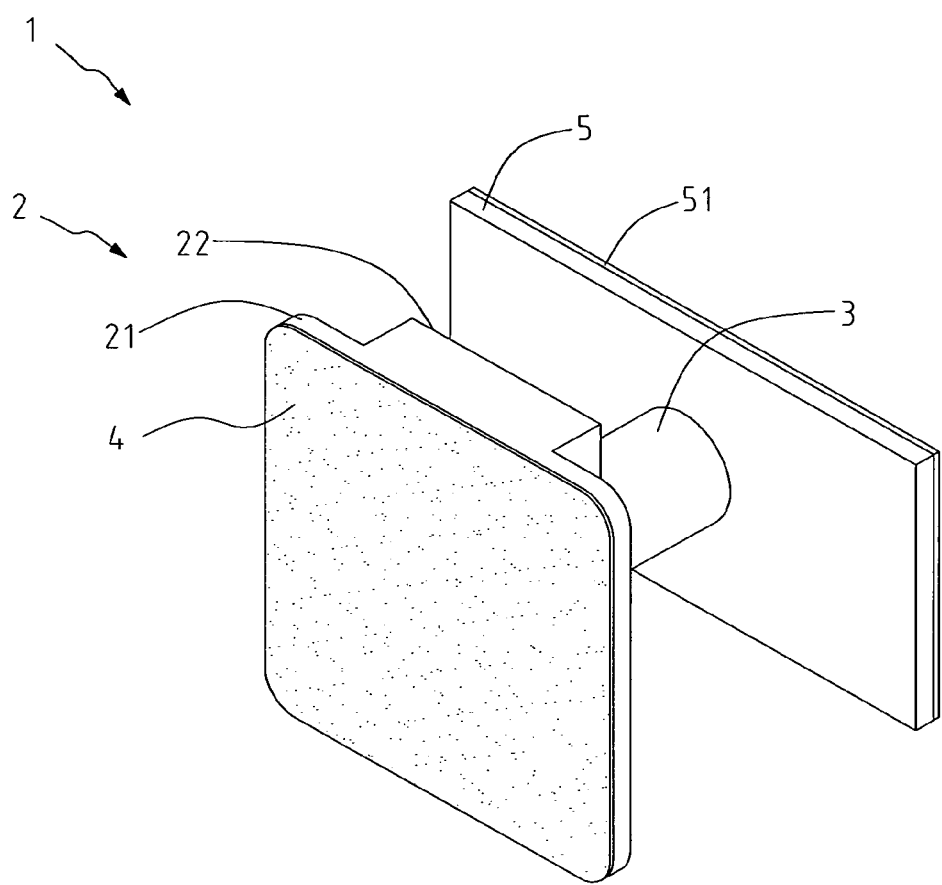
FIG. 1 is a perspective assembly view of a fixing device of the present invention.
Figure 2:
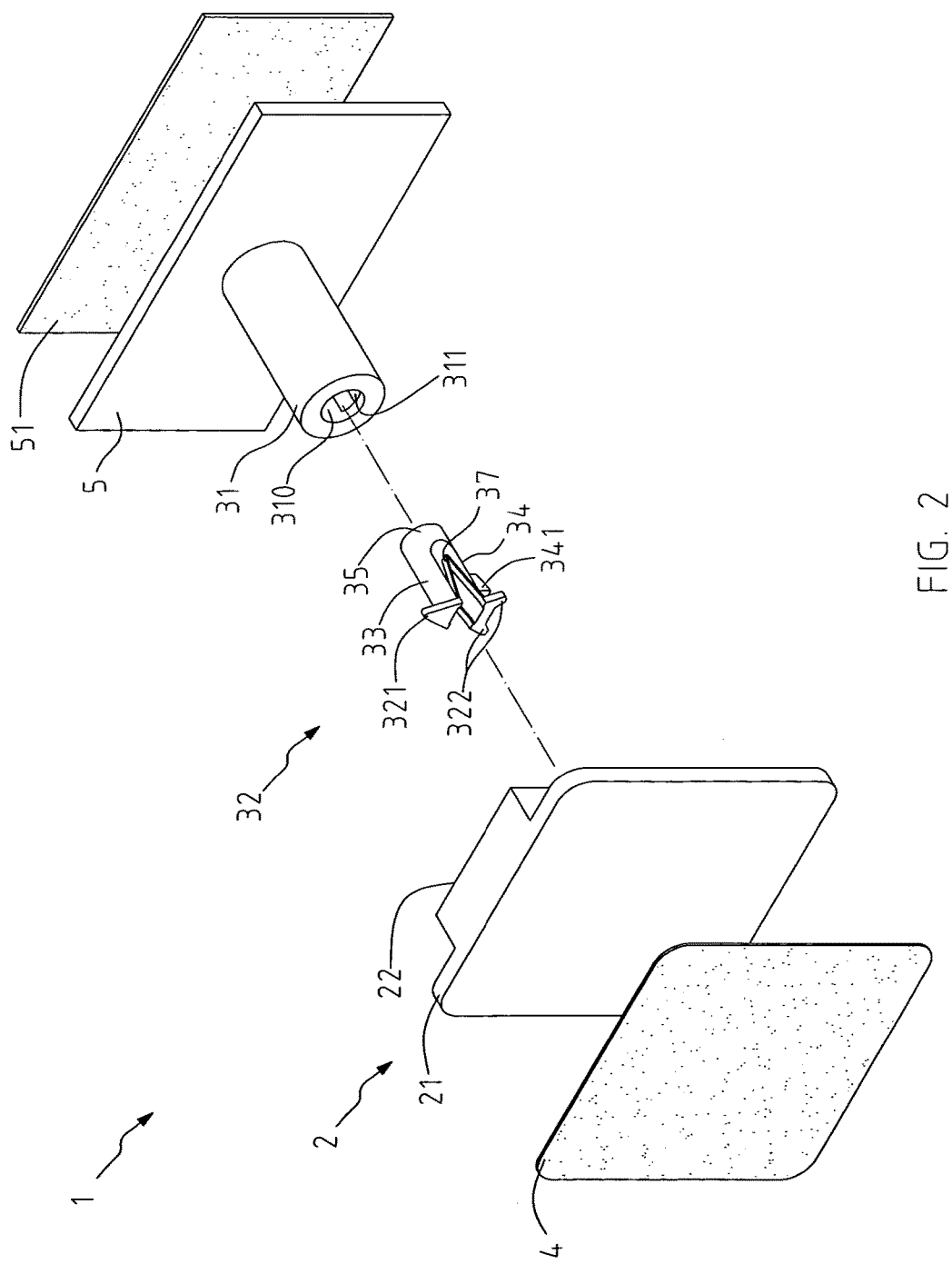
FIG. 2 is an perspective exploded view of FIG. 1.
Figure 3:
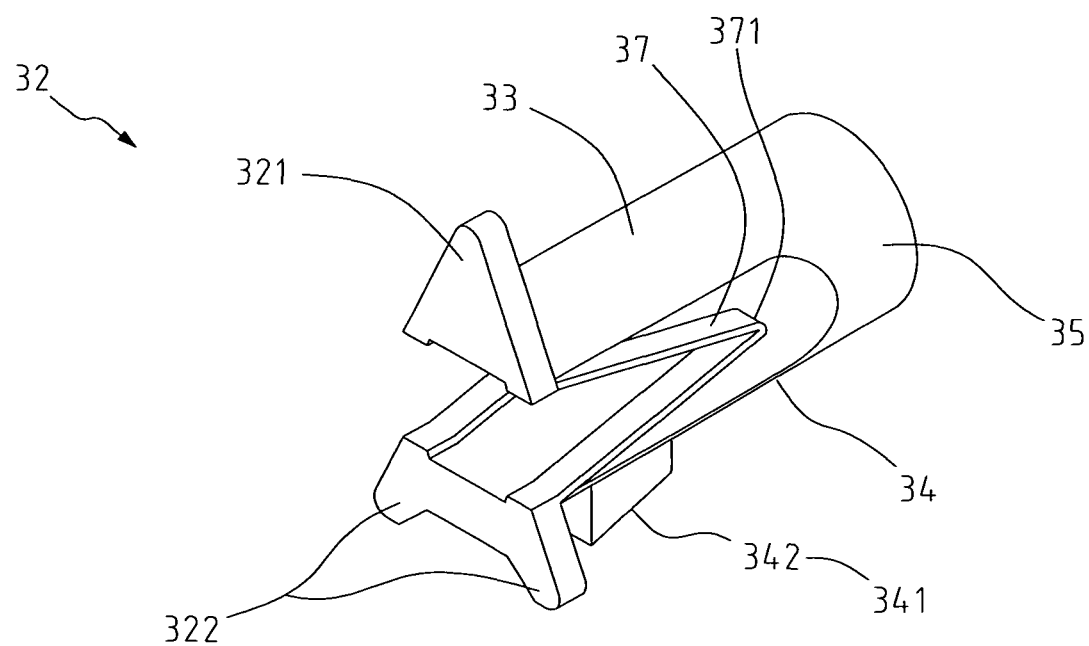
FIG. 3 is a schematic perspective view of an engaging element of the present invention.
Figure 4:
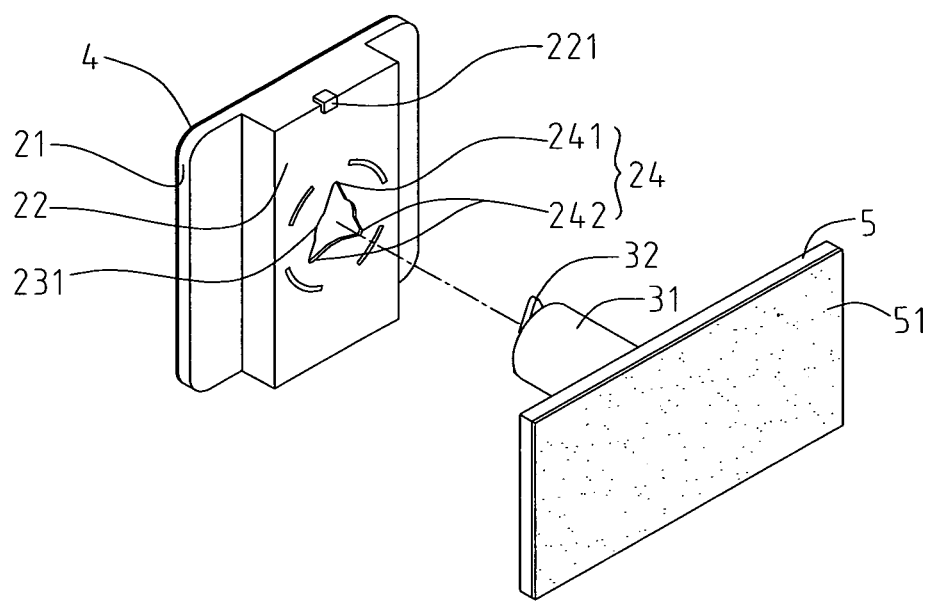
FIG. 4 is a schematic partial assembly view of the fixing device of the present invention.

Referring to FIGS. 1 to 11 illustrating a preferable embodiment of a fixing device of the present invention, the fixing device 1 comprises a base body 2, a connecting unit 3, and a fixing unit 5. The base body 2 comprises a holding wall 21 and a connecting wall 22 spaced apart from the holding wall 21, peripheries of the holding wall 21 and the connecting wall 22 are connected to each other. A connecting hole 23 is formed at a middle to lower portion of the connecting wall 22, and a plurality of tooth-like grooves 24 radially extend outward from peripheries of the connecting hole 23. The plurality of tooth-like grooves 24 are spaced apart from each other and include a first groove 241 and two second grooves 242. The first groove 241 is located at an upper portion of the connecting hole 23, and the second grooves 242 are located at a lower portion of the connecting hole 23. Inner contours of the first and second grooves 241 and 242 respectively form guiding edges (not shown) having an inclined shape for facilitating the process of engagement of the connecting unit 3. As shown in FIG. 4, the first groove 241 and the two second grooves 241 cooperatively form the connecting hole 23 having a substantially triangle shape with two lateral arc sides 231. A surface of the holding wall 21 opposite to the connecting wall 22 is provided with a holding element 4. In this embodiment, the holding element 4 is a double-sided adhesive, one side of the holding element 4 adheres to the holding wall 21, the other side of the holding element 4 adheres to a first external object 8, for example, such as a mobile phone or a tablet PC.

Figure 10:
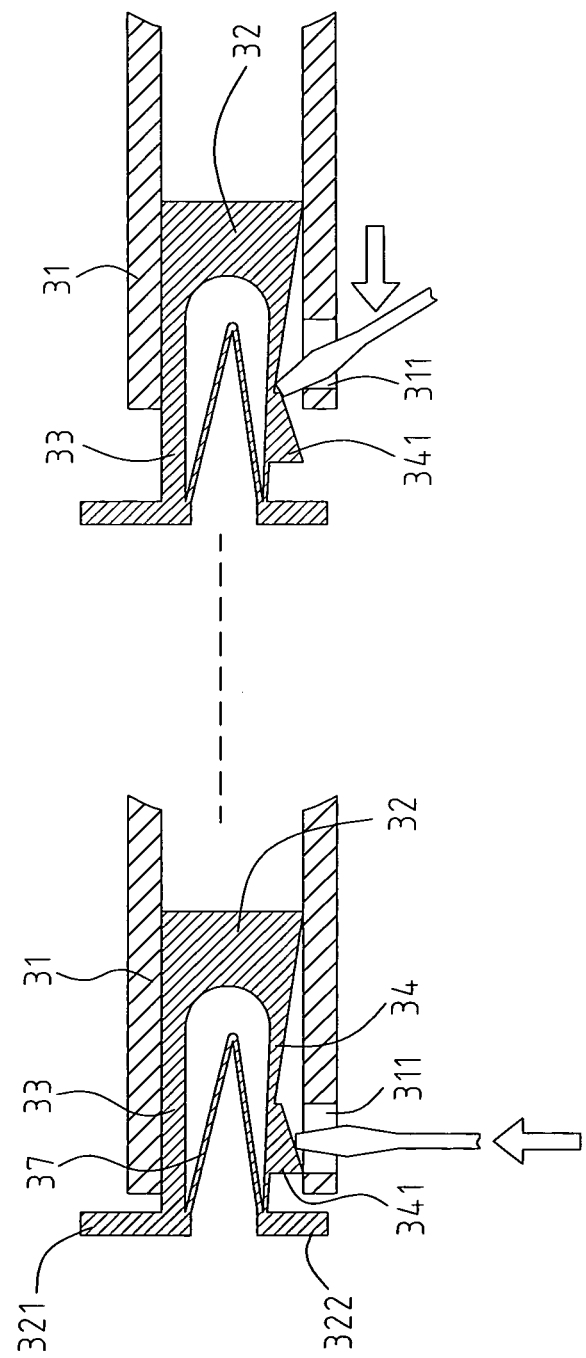
FIG. 10 is a schematic cross-sectional view showing that how the engaging element is ejected from a connecting pole of the present invention.
Figure 11:
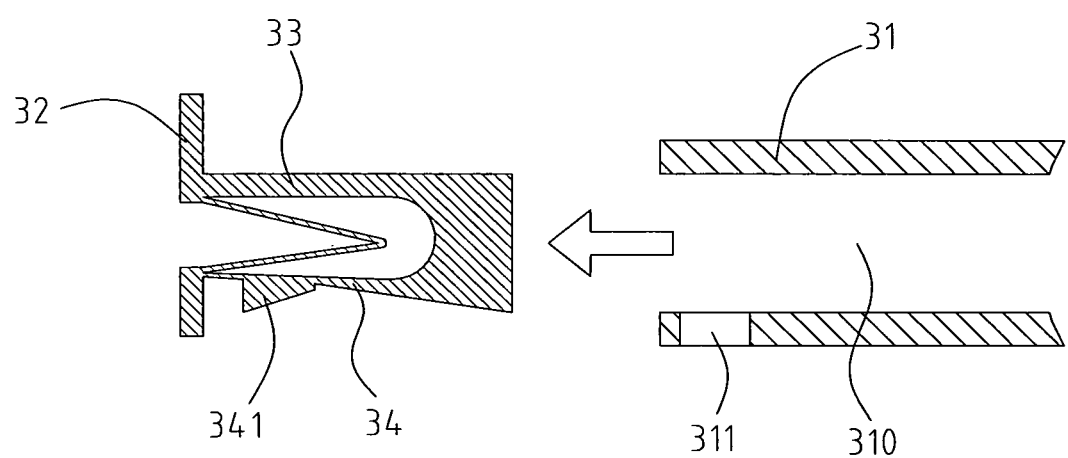
FIG. 11 is a schematic view showing the engaging element completely ejected from the connecting pole.

The connecting unit 3 comprises a connecting pole 31 and an engaging element 32. The connecting pole 31 forms a hollow portion 310 therein which penetrates one end of the connecting pole 31. The length of the connecting pole 31 can be varied depending on practical applications. The engaging element 32 is detachably disposed in the hollow portion 310, and comprises an upper arm 33, a lower arm 34 and a coupling arm 35 coupling the upper and lower arms 33 and 34 at an end portion of the engaging element 32. Particularly, the engaging element 32 has a round tubular shape, wherein the upper and lower arms 33 and 34 are evenly spaced apart from each other with respect to a vertical middle portion of the coupling arm 35. The upper arm 33 forms a first engaging leg 321 at a free end of the upper arm 33 opposite to the coupling arm 35. The lower arm 34 forms two second engaging leg 322 at a free end of the lower arm 34 opposite to the coupling arm 35. The first engaging leg 321 and the second engaging legs extend out of the hollow portion 310 and spaced apart from the connecting pole 31 with a space t. Specifically, the first engaging leg 321 bends perpendicularly and extends outward from the free end of the upper arm 33. The two second engaging legs 322 respectively bend perpendicularly and extend outward from the free end of the lower arm 34. The space t is greater than a thickness of the connecting wall 22 but less than a sum of the thickness of the connecting wall 22 and a thickness of the first engaging leg 321, whereby the connecting hole 23 is capable of being embedded into the space t. The connecting pole 23 further comprises a fastening slot 311 at a bottom thereof. The fastening slot 311 penetrates a portion of the connecting pole 23 to communicate with the hollow portion 310. The engaging element 32 is provided with a releasing element 341 which is capable of being fastened to the fastening slot 311. The releasing element 341 is integrally formed on the lower arm 34 and has an inclined surface 342. The releasing element 341 is capable of being depressed from the fastening hole 311 to the hollow portion 310 until the releasing element 341 comes off the fastening slot 311, so as to enable the engaging element 32 to be ejected from the connecting pole 31 (as shown in FIGS. 10 and 11). In this manner, the engaging element 32 is replaceable when it is damaged. Alternatively, the engaging element 32 is integrally formed with the connecting pole 31 in the hollow portion 310 in order to simplify manufacturing and processing procedures.

In particular, a reinforcing element 37 is formed between the upper and lower arms 33 and 34. The reinforcing element 37 comprises two opposite ends respectively connected to the first engaging leg 321 and the second engaging legs 322, and at least a bending portion 371, whereby the reinforcing element 37 has a reversed V shape, but is not limited thereby. The reinforcing element 37 is intended to reinforce strength of cantilever structure of the upper and lower arms 33 and 34 when the upper and lower arms 33 and 34 are being depressed. Moreover, because the upper and lower arm 33 and 34 are connected to and restrained by the reinforcing element 37, the reinforcing element 37 can prevent the upper and lower arms 33 and 34 from causing material fatigue after repeatedly deformation, and further improve flexibility of the upper and lower arms 33 and 34.

With the structure of the above-mentioned embodiment, when the engaging element 32 is to engage with the connecting hole 23, the connecting pole 31 is held obliquely with the first engaging leg 321 placed downward, the first engaging leg 321 firstly passes through the connecting hole 23 and is propped against the first groove 241 to push the upper arm 33 moving downward, then the second engaging legs 322 pass through the corresponding second grooves 242, so that the first and second engaging legs 321 and 322 are capable of passing through the connecting hole 23 to abut against the first and second grooves 241 and 242. As a result, the connecting pole 31 is firmly connected with the base body 2, and the holding element 4 is to adhere to the first external object 8 (i.e. mobile phone), and the fixing unit 5 is to adhere to a second external object 7, for example, such as a wall or a surface of an object. In this manner, users can use the first external object 8 without holding it. Likewise, in removing the connecting pole 31, push the connecting pole 31 upward or downward to depress the upper arm 33 or the lower arm 34, then the connecting pole 31 is obliquely ejected from the base body 2. Alternatively, in cooperation with the guiding edges of the first and second grooves 241 and 242, the engaging element 32 is capable of horizontally inserted in the connecting hole 23, with the first and second engaging legs 321 and 322 being propped against the first and second grooves 241 and 241 so as to force the upper and lower arms 33 and 34 to be depressed towards each other, whereby the engaging element 32 is allowed to pass through the connecting hole 23. In another embodiment, the releasing element 341 is capable of being depressed to push the lower arm 34 tilting upward, whereby the space between the upper and lower arms 33 and 34 is narrowed, and the engaging element 32 is capable of being rejected.

Figure 12:
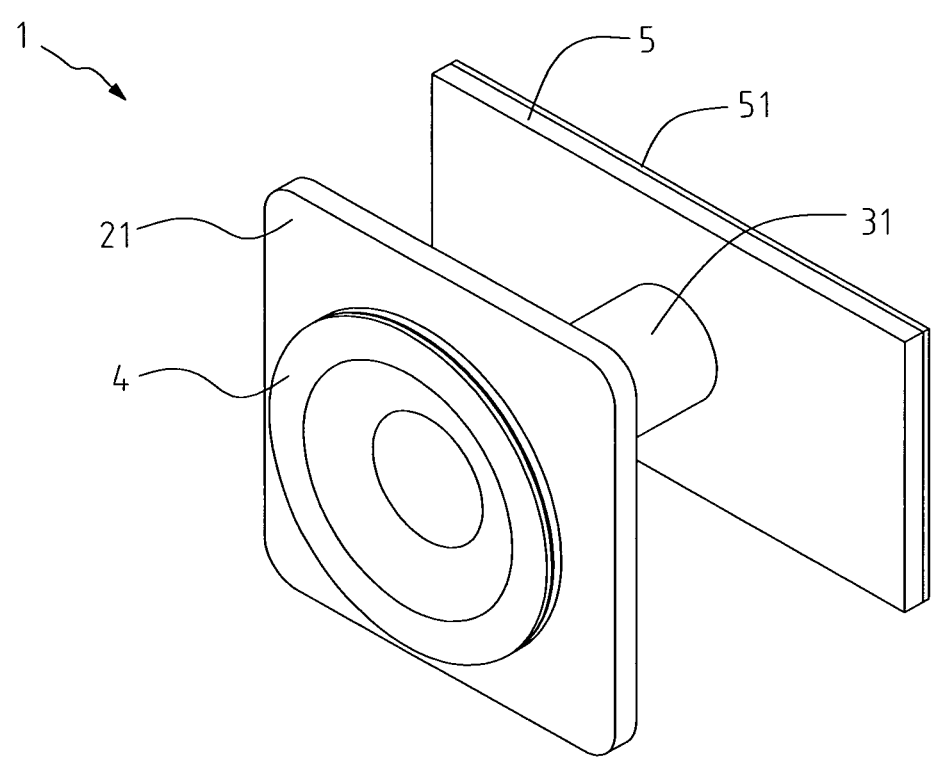
FIG. 12 is a schematic perspective view of another embodiment of the present invention.
Figure 13:
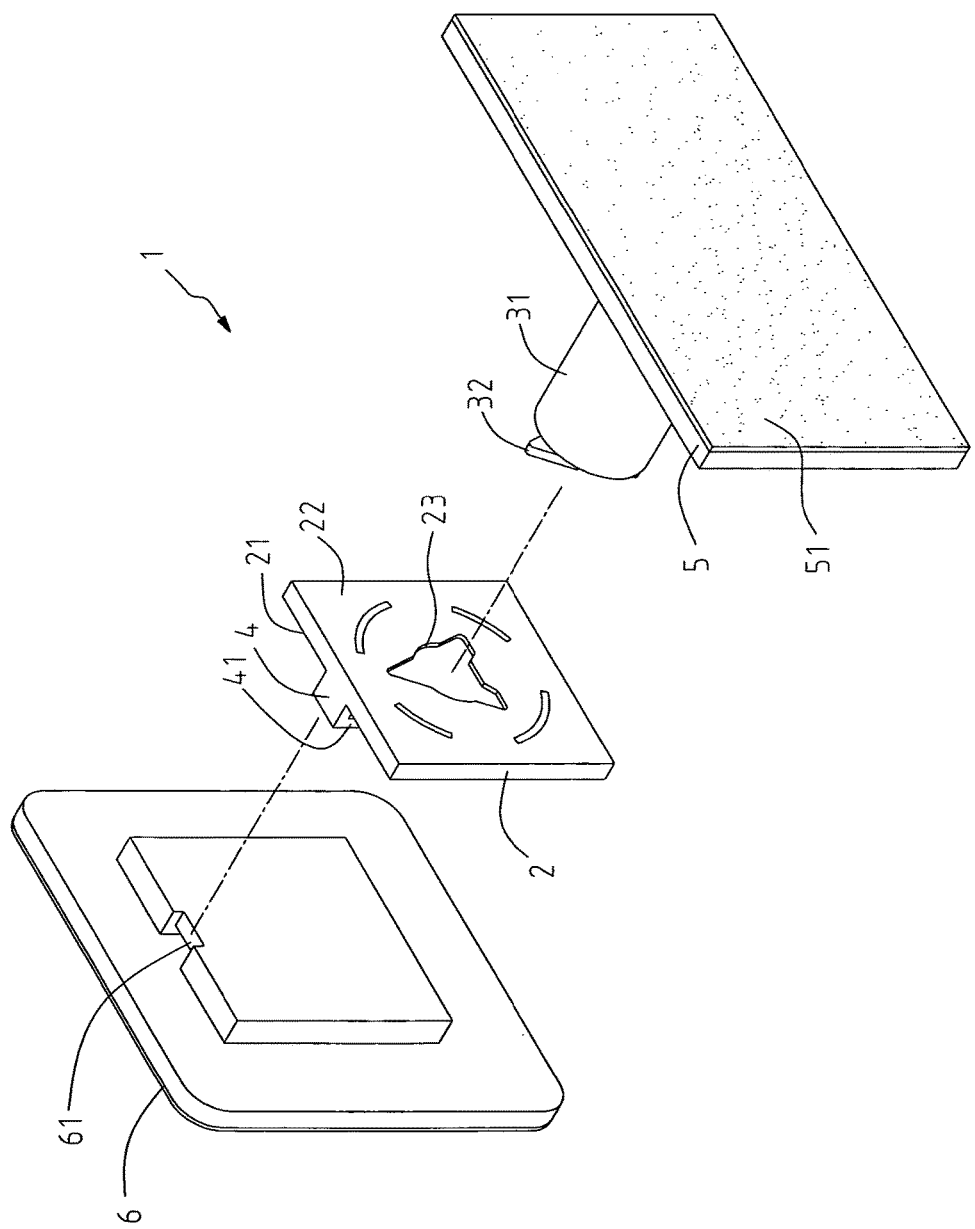
FIG. 13 is an exploded perspective view of another embodiment of the fixing device of the present invention.
Figure 14:
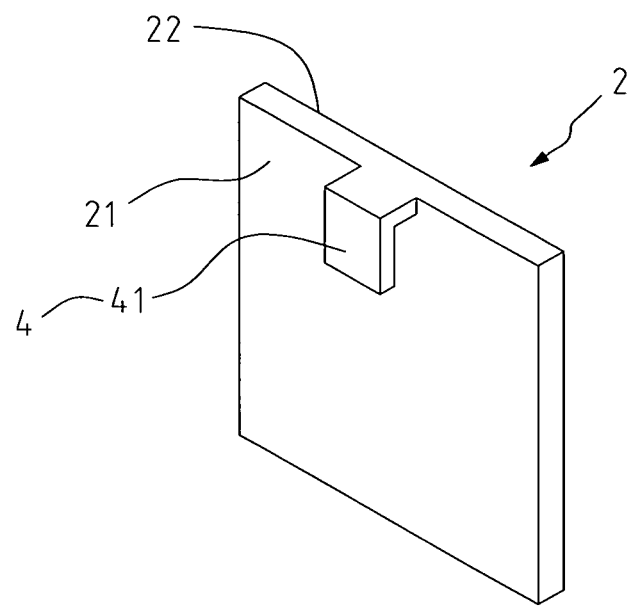
FIG. 14 is a schematic perspective view of a base body of FIG. 13.
Figure 15:
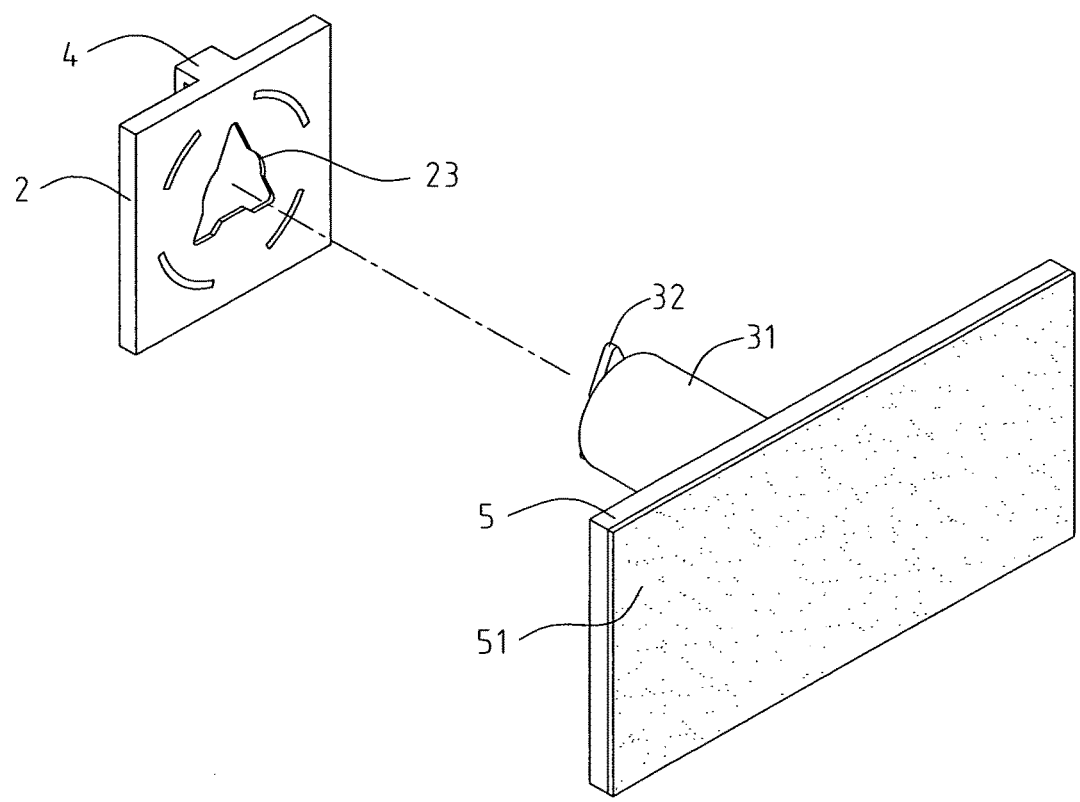
FIG. 15 is a partial assembly view of the fixing device of FIG. 13.
Figure 16:
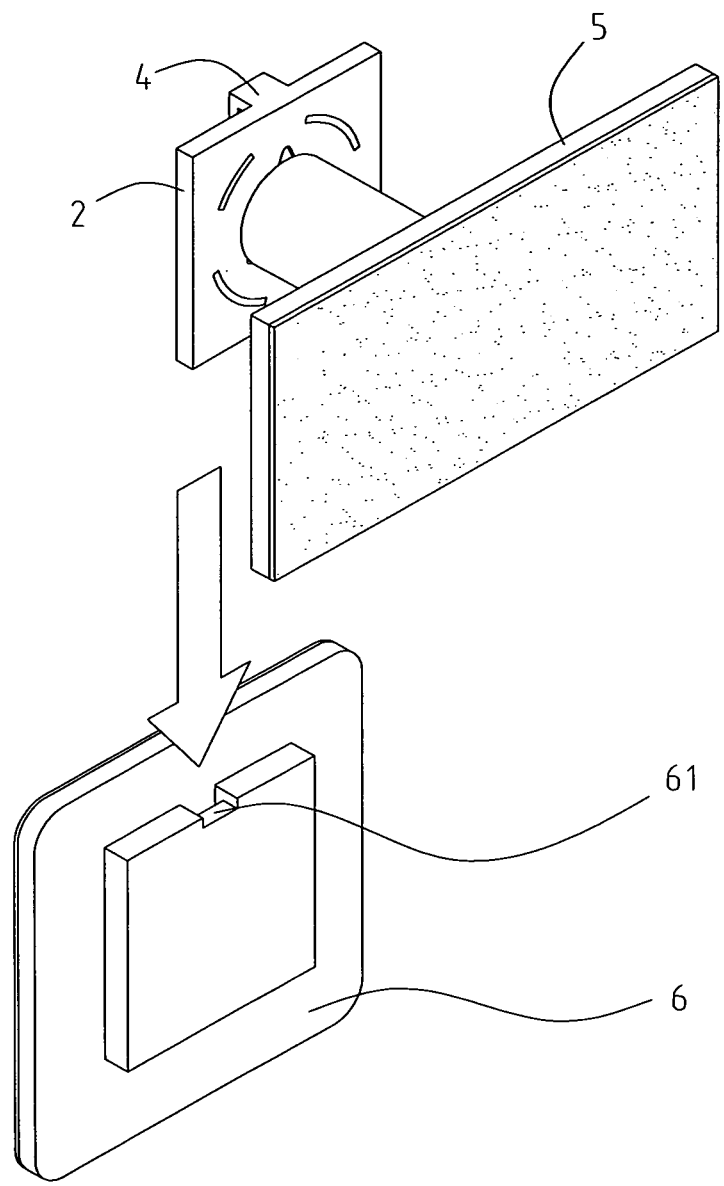
FIG. 16 is a schematic process view showing the base body of FIG. 13 hooked onto a positioning frame of the present invention.
Figure 17:
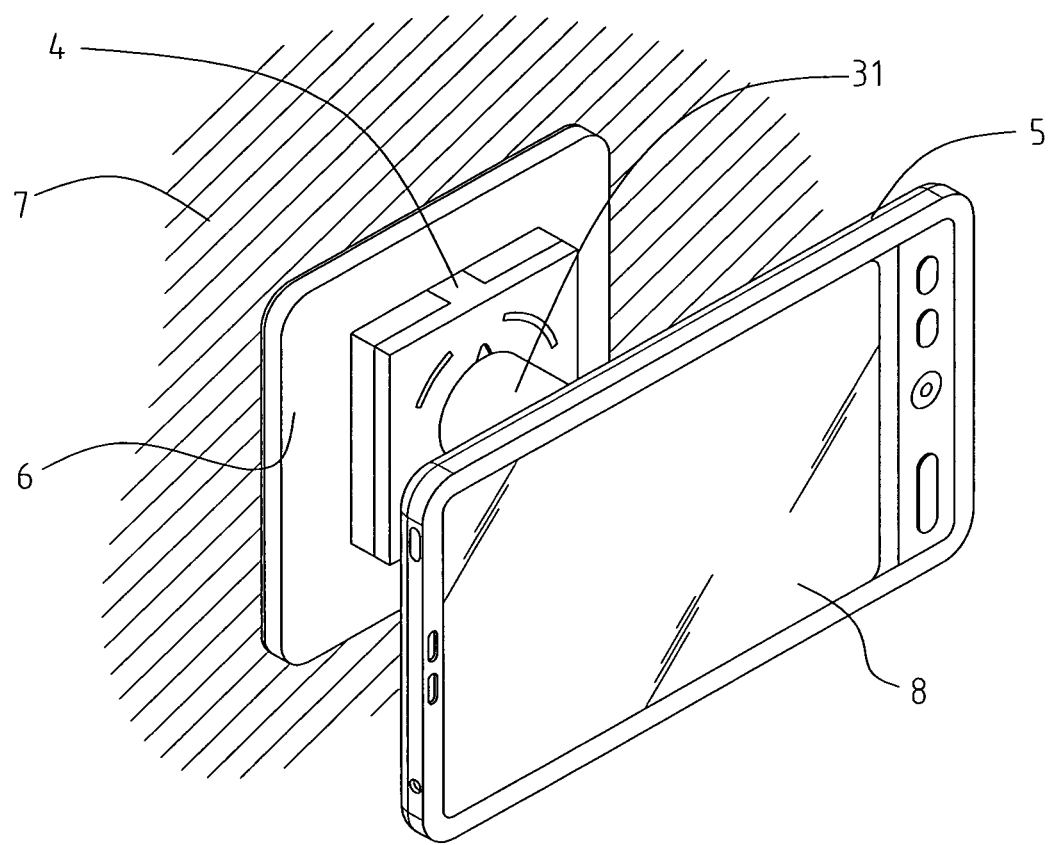
FIG. 17 is a schematic view showing a practical implementation of the fixing device of FIG. 13.

Referring to FIG. 12 showing another embodiment of the present invention, the holding element 4 and the fixing element 51 are respectively exemplified by a hook-and-loop fastener (not shown) or a sucking disk, or either the holding element 4 or the fixing element 51 is the hook-and-loop fastener or the sucking disk. The sucking disk functions as the double-sided adhesive for enabling the base body 2 to hold the first external object 8 with suction force. Furthermore, in the embodiment of double-sided adhesive, the holding wall 21 and the fixing unit 5 both have a board shape which is configured to adhere to the first external object 8 or the second external object 7. Alternatively, the holding wall 21 and the connecting unit 5 can be formed with at least one through hole (not shown) for reducing the amount of material for manufacturing without affecting adhesion of the double-sided adhesive to the holding element 4 and the fixing element 51.

Figure 8:
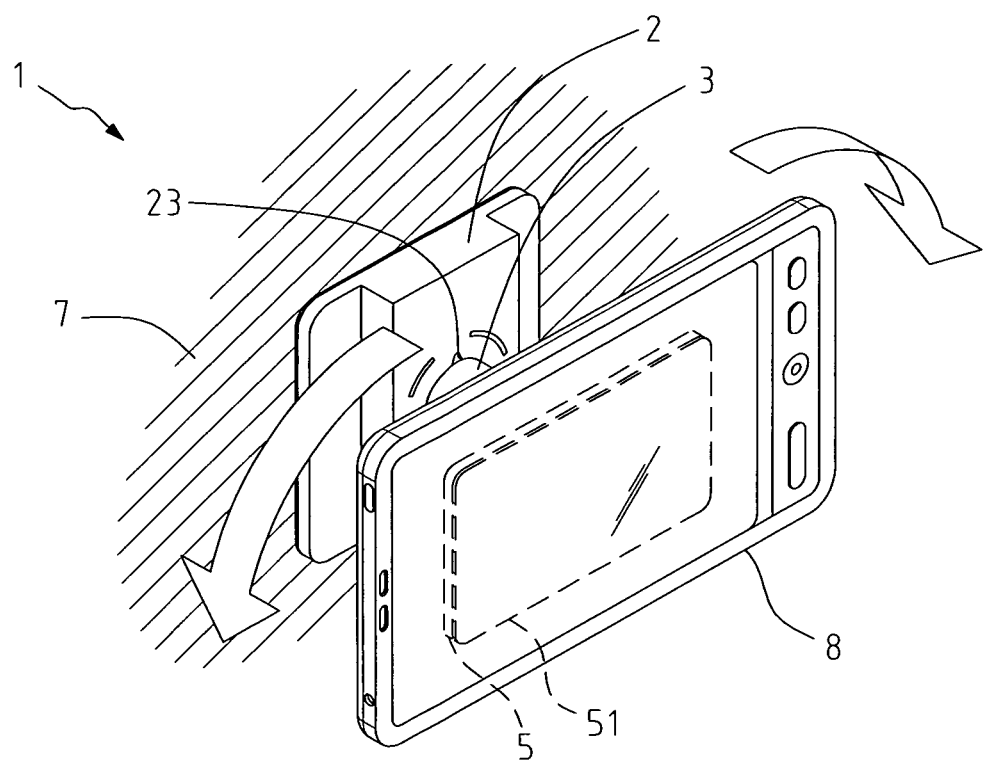
FIG. 8 is a schematic view showing another state of practical use of the present invention.
Figure 9:
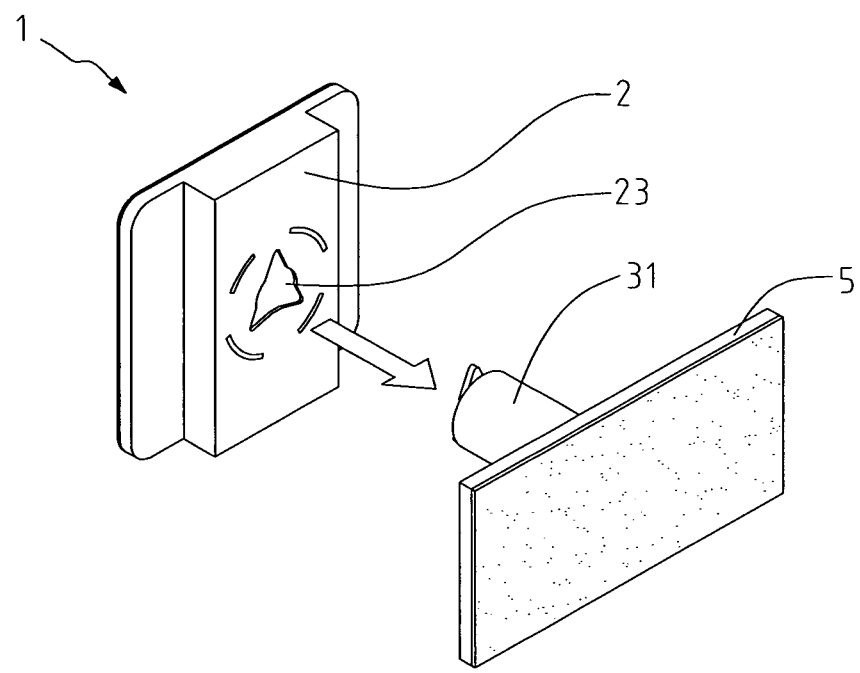
FIG. 9 is a schematic view showing the connecting unit detached from the base body.

Referring to FIG. 8 showing an alternative application of the present invention, the holding element 4 here is to adhere to the second external object 7 (i.e. a wall surface), while the fixing element 51 is to adhere to the first external object 8 (i.e. mobile phone). In this manner, the fixing device 1 also provides the hands-free function that users can uses the mobile phone without holding it.

Figure 5:
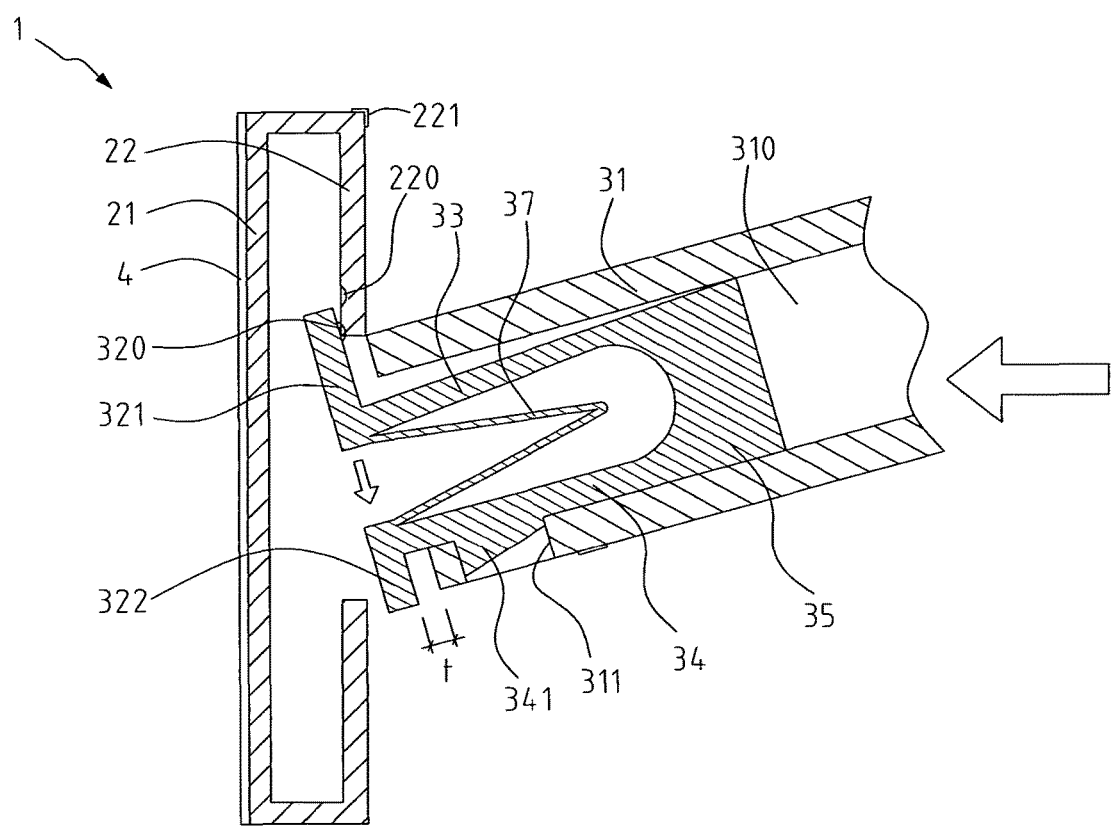
FIG. 5 is a schematic cross-sectional view showing a process of a connecting unit connected to a base body of the present invention.
Figure 6:
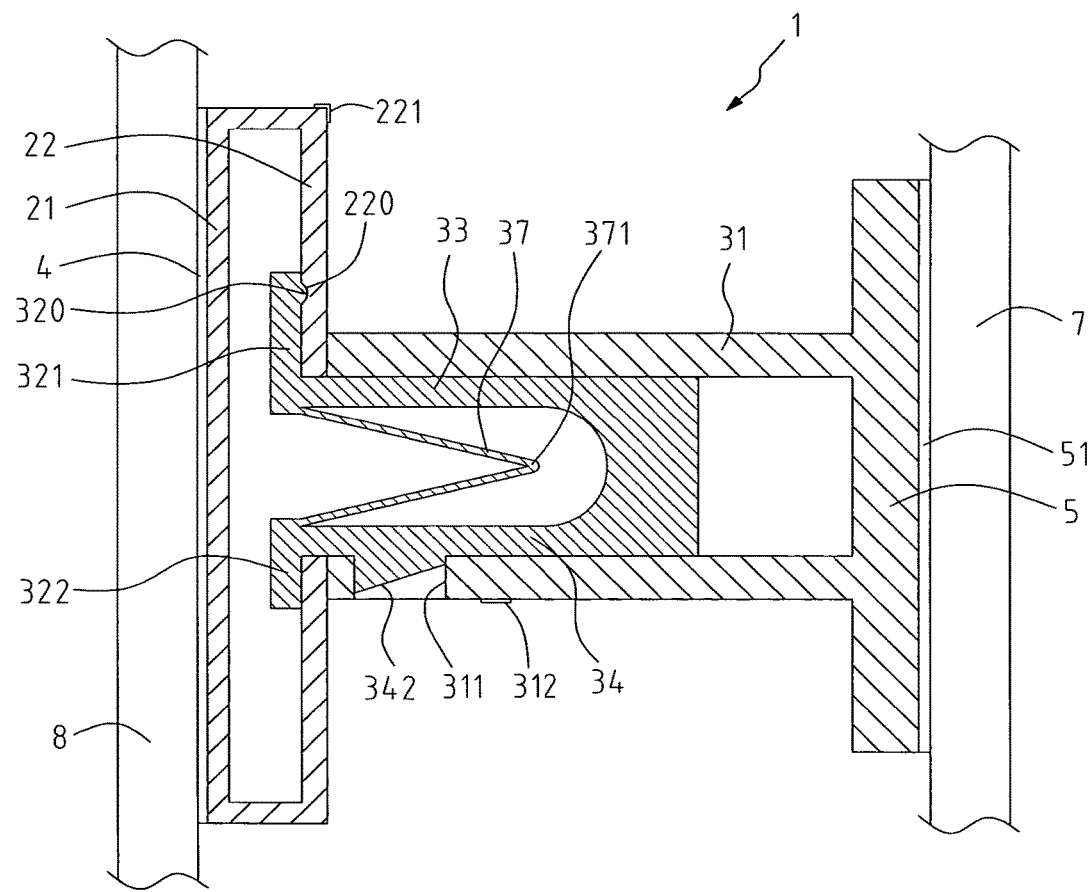
FIG. 6 is a schematic cross-sectional view showing the connecting unit positioned in the base body.
Figure 7:
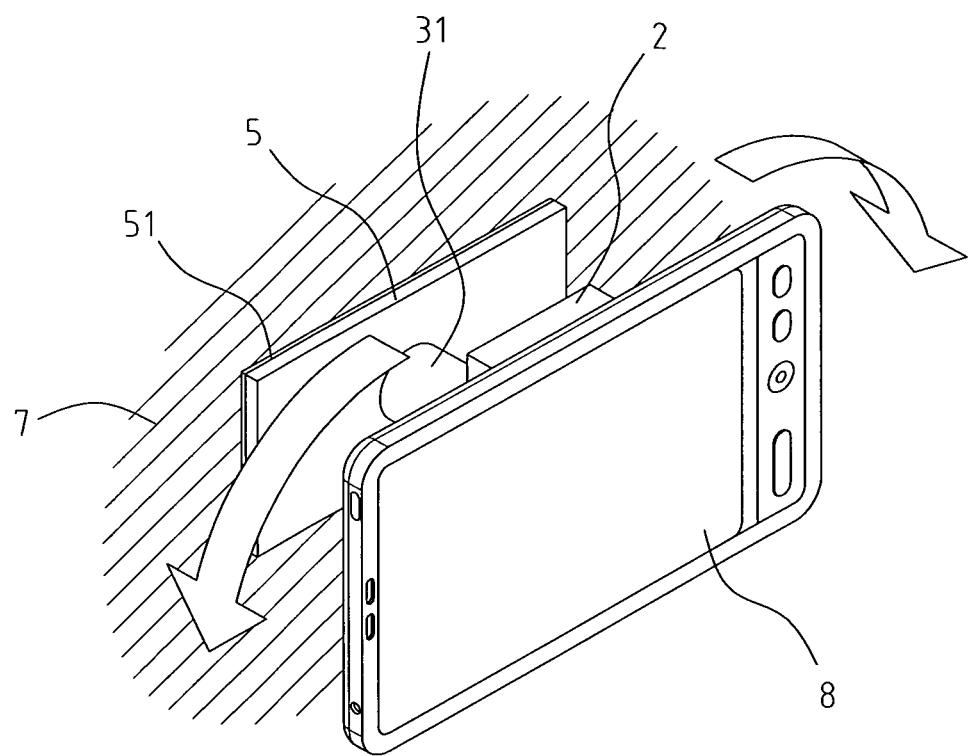
FIG. 7 is a schematic view showing a practical implementation of the present invention.

It is particularly noted that the base body 2 is rotatable upon the connecting pole 31, inasmuch as the first and second engaging legs 321 and 322 are spaced with the space t from the connecting pole 31, the base body 2 rotatable upon the connecting pole 31 through the connecting hole 23, or the first and second engaging legs 321 and 322 of the engaging element 32 are rotatable between the holding wall 21 and the connecting wall 35 and thus simultaneously rotate the connecting pole 31. Furthermore, as shown in FIGS. 5 and 6, an interference portion 320 is formed on one side of the first engaging leg 321 or the second engaging leg 322 facing the connecting pole 31; a plurality of embedding portions 220 are formed on one side of the connecting wall 22 facing the holding wall 21. The interference portion 320 is embedded into either one of the embedding portions 220 relative to rotation of the base body 2 or rotation of the connecting pole 31, so as to realize positioning in rotation. Additionally, the engagement of the embedding portions 220 and the interference portion 320 also provides a sound response and a touching response to users. In the course of rotation, the lateral arc sides 231 are recessed outwardly to provide a further zoom for the first and second grooves 241 and 242 when the base body 2 rotates, whereby facilitating rotation of the base body 2 and providing multi-stage of rotation.

The fixing unit 5 is integrally formed with the end of the connecting pole 31 and is rotatable in conjunction with the rotation of the connecting pole 31. In this manner, users can rotate either the base body 2 or the fixing unit 5 to a desired degree or position. Furthermore, the contours of the connecting hole 23 are not limited by the shape depicted in FIG. 4. Other irregular contours of the connecting hole 23 being configured to connect the engaging element 32 is also applicable.

Furthermore, the base body 2 is provided with a first disengaging mark 221 (as shown in FIG. 4) on a surface thereof above the first groove 241. The connecting pole 31 is provided with a second disengaging mark 312 as shown in FIG. 6) on an outer surface thereof. Because the connecting hole 23 is shaped as a triangle, the engaging element 32 is designed to be allowed to disengage from the connecting hole 23 of the base body 2 only when the first disengaging mark 221 is located right above the second disengaging mark 312 and is vertically coplanar with the second disengaging mark 312.

Referring to FIGS. 12 to 17 illustrating a second embodiment of the present invention, in this embodiment, the fixing device 1 is mainly consisted of three pieces, happening into either base body, or between connecting unit and fixing unit. Specifically, the fixing device 1 of this embodiment further comprises a positioning frame 6, which includes a positioning slot 61 formed at a side of the positioning frame 6. The holding element 4 of the base body 2 extends laterally and bends downward to form a positioning bar 41 for being inserted into the positioning slot 61 to connect the base body 2 to the positioning frame 6. A side of the positioning frame 6 opposite to the positioning slot 61 is adhesive to the first external object 8 or the second external object 7. Other structural components not mentioned in this embodiment are same as those described in the foregoing embodiment. In this second embodiment, the base body 2 is hooked onto the positioning frame 6, and therefore provides a quicker and easier way of taking off the entire set of the connecting unit 3 and the base body 2. Alternatively, the positioning frame 6 having the positioning slot 61 is formed on a side of the fixing unit 5 (not shown), while the positioning bar 41 is formed on one end of the connecting pole 3 facing the fixing unit 5 (not shown). As a result, the connecting pole 3 is capable of being hooked onto the fixing unit 5 with the positioning bar 41 inserted into the positioning slot 61, whereby the fixing unit 5 adheres to the second external object 7 (e.g. a wall surface), and the base body 2 adheres to the first external object 8 (e.g. mobile device).

Figure 18:
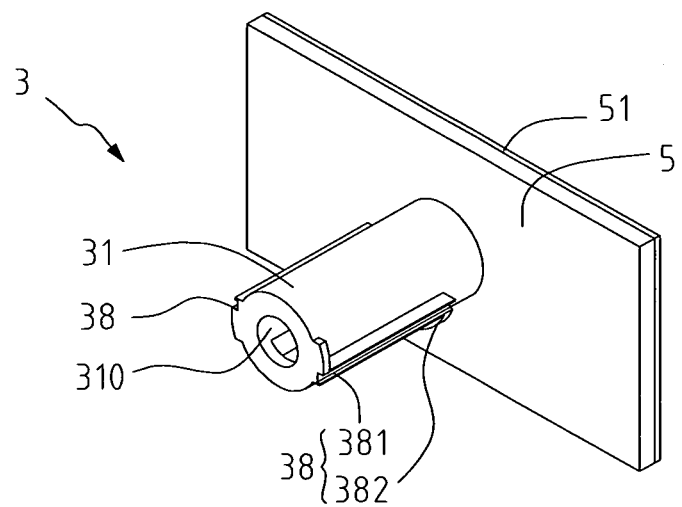
FIG. 18 is a perspective view showing another embodiment of a connecting pole of the present invention.

Referring to FIG. 18, two opposite sides of the connecting pole 31 respectively form a track apparatus 38, comprising a channel 381 and a limiting portion 382. The channel 381 is open widely, and the limiting portion 382 bends from one end of the channel 381 and extends along a part of the connecting pole 31. The track apparatus 38 are configured to connect the base body 2 in a manner different to the engagement of the engaging element 32. In this regard, the base body 2 is provided with a mating unit (not shown) configured to couple the track apparatus 38, wherein the channel 381 is connectable to the mating unit and the limiting portion 382 limits the connecting course.

Accordingly, the fixing device 1 of the present invention utilize the detachable engaging element 32 and the base body 2 to provide a simple structure that enables a quick and easy way of engagement and disengagement. The holding element 4 and the fixing element 51 exemplified by the double-sided adhesive are capable of adhering to the first external object 8 or the second external object 7 for realizing the hands-free advantage and overcoming the drawback of traditional securing apparatus required to be held by users. Furthermore, rotation of the base body 2 enables orientation adjustments of the first external object 8 in use.

It is understood that the invention may be embodied in other forms within the scope of the claims. Thus the present examples and embodiments are to be considered in all respects as illustrative, and not restrictive, of the invention defined by the claims.

What is claimed is:

1. A fixing device, comprising:
   a base body comprising a holding wall and a connecting wall spaced apart from the holding wall, the connecting wall forming a connecting hole thereon, the connecting hole comprising a plurality of tooth-like grooves radially extending outward from peripheries of the connecting hole, a surface of the holding wall opposite to the connecting wall being provided with a holding element for holding the base body onto a first external object;
   a connecting unit comprising a connecting pole and an engaging element, the connecting pole forming a hollow portion therein which penetrates one end of the connecting pole, the engaging element disposed in the hollow portion and comprising at least a first engaging leg and at least a second engaging leg respectively extending out of the hollow portion and spaced apart from the connecting pole, the at least a first engaging leg and a second engaging leg correspondingly passing through the plurality of tooth-like grooves of the connecting hole to be engaged in between the connecting wall and the holding wall, so as to connect the connecting unit and the base body and allow the base body to be rotatable upon the connecting pole; and
   a fixing unit connected to another end of the connecting pole, a surface of the fixing unit provided with a fixing element for securing the fixing unit onto a second external object.

2. The fixing device of claim 1, wherein the engaging element comprises an upper arm, a lower arm and a coupling arm coupling the upper and lower arms, the upper arm forming the at least a first engaging leg at a free end of the upper arm opposite to the coupling arm, the lower arm forming the at least a second engaging leg at a free end of the lower arm opposite to the coupling arm, and the upper and lower arms being spaced apart from each other with respect to a vertical middle portion of the coupling arm.

3. The fixing device of claim 2, wherein the first engaging leg bends perpendicularly and extends outward from the free end of the upper arm, the lower arm includes two the second engaging legs which respectively bend perpendicularly and extend outward from the free end of the lower arm, the plurality of tooth-like grooves include a first groove and two second grooves, and wherein when the engaging element is to engage with the connecting hole, the first engaging leg and the second engaging legs respectively pass though the corresponding first and second grooves, with the first engaging leg being propped against the first groove to push the upper arm towards the lower arm or the second engaging legs being propped against the second grooves to push the lower arm towards the upper arm, so that the first and second engaging legs are capable of passing through the connecting hole to abut against the first and second grooves.

4. The fixing device of claim 3, wherein the first and second engaging legs of the engaging element are rotatable between the holding wall and the connecting wall, the base body is provided with a first disengaging mark on a surface thereof above the first groove, the connecting pole is provided with a second disengaging mark on an outer surface thereof, and when the first disengaging mark is located right above the second disengaging mark and is vertically coplanar with the second disengaging mark, the engaging element is allowed to disengage from the connecting hole of the base body.

5. The fixing device of claim 2, wherein a reinforcing element is formed between the upper and lower arms, the reinforcing element comprising two opposite ends respectively connected to the at least a first engaging leg and the at least a second engaging leg, and the reinforcing element comprising at least a bending portion.

6. The fixing device of claim 1, wherein the connecting pole further comprises at least a fastening slot penetrating a portion of the connecting pole to communicate with the hollow portion, the engaging element provided with a releasing element capable of being fastened to the fastening slot, where the releasing element is depressible from the fastening hole to the hollow portion, so as to enable the engaging element to disengage from the fastening slot and to be ejected from the connecting pole.

7. The fixing device of claim 1, wherein the holding element and the fixing element are respectively a double-sided adhesive, one side of the holding element adheres to the holding wall, another side of the holding element adheres to the first external object, one side of the fixing element adheres to the fixing unit, and another side of the fixing element adheres to the second external object.

8. The fixing device of claim 1, wherein the holding element and the fixing element are respectively a hook-and-loop fastener or a sucking disk, or either the holding element or the fixing element is the hook-and-loop fastener or the sucking disk.

9. The fixing device of claim 1, wherein an interference portion is formed on one side of the first engaging leg or the second engaging leg facing the connecting pole, a plurality of embedding portions are formed on one side of the connecting wall facing the holding wall, and the interference portion is embedded into either one of the embedding portions relative to rotation of the base body.

10. The fixing device of claim 1, further comprising a positioning frame including a positioning slot formed at a side of the positioning frame, the holding element of the base body or the fixing unit extends laterally and bends downward to form a positioning bar for being inserted into the positioning slot to connect the base body or the fixing unit to the positioning frame, and a side of the positioning frame opposite to the positioning slot is adhesive to either the first external object or the second external object.

* * * * *